United States Patent
Shimo et al.

(10) Patent No.: US 11,955,295 B2
(45) Date of Patent: Apr. 9, 2024

(54) PHOTOELECTRIC CONVERSION ELEMENT AND METHOD FOR MANUFACTURING THE SAME

(71) Applicant: KABUSHIKI KAISHA TOSHIBA, Tokyo (JP)

(72) Inventors: Shunsuke Shimo, Yokohama (JP); Kenji Todori, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 351 days.

(21) Appl. No.: 17/404,313

(22) Filed: Aug. 17, 2021

(65) Prior Publication Data
US 2022/0285103 A1 Sep. 8, 2022

(30) Foreign Application Priority Data
Mar. 8, 2021 (JP) .................................. 2021-035964

(51) Int. Cl.
*H01L 31/032* (2006.01)
*H01G 9/20* (2006.01)
(Continued)

(52) U.S. Cl.
CPC ........... *H01G 9/2045* (2013.01); *H10K 30/10* (2023.02); *H10K 71/12* (2023.02)

(58) Field of Classification Search
None
See application file for complete search history.

(56) References Cited

U.S. PATENT DOCUMENTS

| 3,718,511 A | * | 2/1973 | Moulin | ............. H01L 21/02417 |
|---|---|---|---|---|
| | | | | 148/DIG. 63 |
| 2002/0002992 A1* | | 1/2002 | Kariya | ................... H01L 31/202 |
| | | | | 257/432 |

(Continued)

FOREIGN PATENT DOCUMENTS

| JP | WO 2018/123402 A1 | 7/2018 |
|---|---|---|
| JP | 2019-145621 A | 8/2019 |

(Continued)

OTHER PUBLICATIONS

Kondo, T. "Study for light—emitting devices using metal-halide perovskite-type semiconductors" (2018), 8 pages (with English Machine Translation).

(Continued)

*Primary Examiner* — Benjamin P Sandvik
(74) *Attorney, Agent, or Firm* — Oblon, McClelland, Maier & Neustadt, L.L.P.

(57) ABSTRACT

According to one embodiment, a photoelectric conversion element includes a first conductive layer, a second conductive layer, a photoelectric conversion layer located between the first conductive layer and the second conductive layer. The photoelectric conversion layer includes Sn and Pb. The photoelectric conversion layer includes a first partial region, a second partial region between the first partial region and the second conductive layer, and a third partial region between the second partial region and the second conductive layer. The first partial region includes a first Sn concentration and a first Pb concentration. The second partial region includes at least one of a second Sn concentration or a second Pb concentration. The second Sn concentration is less than the first Sn concentration. The second Pb concentration is greater than the first Pb concentration. The third partial region includes Sn, oxygen, and Pb.

15 Claims, 8 Drawing Sheets

(51) Int. Cl.
*H10K 30/10* (2023.01)
*H10K 71/12* (2023.01)

(56) References Cited

U.S. PATENT DOCUMENTS

2016/0020411 A1* 1/2016 Lee .................. H10K 30/151
438/82
2019/0173025 A1 6/2019 Uchida et al.

FOREIGN PATENT DOCUMENTS

JP 6670138 B2 3/2020
WO WO2019/195194 A 10/2019

OTHER PUBLICATIONS

Lei, Y. et al. "A fabrication process for flexible single-crystal perovskite devices", Nature, vol. 583, (Jul. 30, 2020), 18 pages.

Ogomi, Y. et al. "Sn/Pb binary perovskite solar cells and organic amine-free perovskite solar cells" Kyushu Institute of Technology, (2015), 2 pages.

Hayase, S. "Sn-Based Halide Perovskite Solar Cells" The University of Electro-Communications, Info-Powered Energy System Research Center. (2021), 30 pages.

Ogomi, Y. et al. "Infrared light sensitive Sn/Pb binary perovskite solar cells with improved stability in air and organic amine-free perovskite solar cells with improved stability against light exposure", Kyushu Institute of Technology, The university of Electro-communication, (2015), 4 pages.

Fan, J . . . et al., "Molecular Self-Assembly Fabrication and Carrier Dynamics of Stable and Efficient $CH_3NH_3Pb_{(1-x)}Sn_xI_3$ Perovskite Solar Cells", Chem. Pub Soc., ChemSusChem., vol. 10, No. 19, Jun. 22, 2017, XP055886143, pp. 3839-3845.

Liu, X., et al., "Efficient Planar Heterojunction Perovskite Solar Cells with Weak Hysteresis Fabricated via Bar Coating", Solar Energy Materials & Solar Cells, Elsevier Science Publishers, vol. 159, Oct. 7, 2016, XP029788612, pp. 412-417.

* cited by examiner

PHOTOELECTRIC CONVERSION ELEMENT AND METHOD FOR MANUFACTURING THE SAME

CROSS-REFERENCE TO RELATED APPLICATIONS

This application is based upon and claims the benefit of priority from Japanese Patent Application No. 2021-035964, filed on Mar. 8, 2021; the entire contents of which are incorporated herein by reference.

FIELD

Embodiments described herein relate generally to a photoelectric conversion element and a method for manufacturing the photoelectric conversion element.

BACKGROUND

For example, it is desirable to improve the characteristics of a photoelectric conversion element.

DETAILED DESCRIPTION

Figure 1:
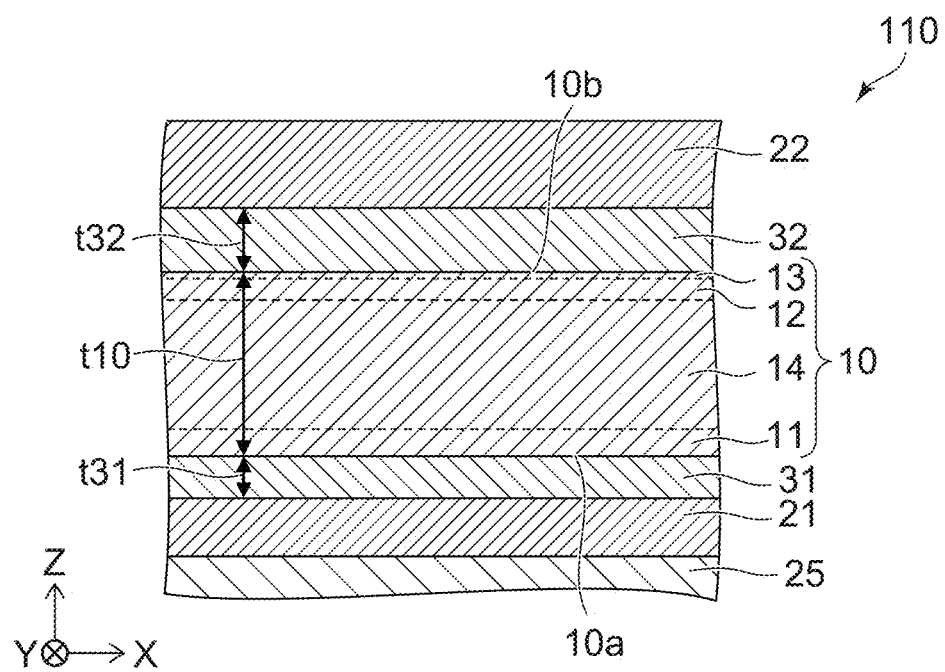
FIG. 1 is a schematic cross-sectional view illustrating a photoelectric conversion element according to a first embodiment.

According to one embodiment, A photoelectric conversion element includes a first conductive layer, a second conductive layer, and a photoelectric conversion layer located between the first conductive layer and the second conductive layer. The photoelectric conversion layer includes Sn and Pb. The photoelectric conversion layer includes a first partial region, a second partial region between the first partial region and the second conductive layer, and a third partial region between the second partial region and the second conductive layer. The first partial region includes a first Sn concentration and a first Pb concentration. The second partial region includes at least one of a second Sn concentration or a second Pb concentration. The second Sn concentration is less than the first Sn concentration. The second Pb concentration is greater than the first Pb concentration. The third partial region includes Sn, oxygen, and Pb.

According to one embodiment, a method for manufacturing a photoelectric conversion element is disclosed. The method can include coating a coating liquid onto a coated body by forming a meniscus between a coating bar and the coated body. The meniscus includes the coating liquid. The coating liquid includes a perovskite precursor and a solvent. The perovskite precursor is used to form a photoelectric conversion layer. The method can include forming the photoelectric conversion layer from the coating liquid by supplying a gas including oxygen toward the coating liquid coated onto the coated body.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a photoelectric conversion element according to a first embodiment.

As shown in FIG. 1, the photoelectric conversion element 110 according to the embodiment includes a first conductive layer 21, a second conductive layer 22, and a photoelectric conversion layer 10. The photoelectric conversion layer 10 is located between the first conductive layer 21 and the second conductive layer 22. The photoelectric conversion layer 10 includes Sn and Pb. As described below, for example, the photoelectric conversion layer 10 has a perovskite crystal structure that includes Sn and Pb.

The photoelectric conversion layer 10 includes a first partial region 11, a second partial region 12, and a third partial region 13. The photoelectric conversion layer 10 may further include a fourth partial region 14. The second partial region 12 is located between the first partial region 11 and the second conductive layer 22. The third partial region 13 is located between the second partial region 12 and the second conductive layer 22. The fourth partial region 14 is located between the first partial region 11 and the second partial region 12. The boundaries between these partial regions may be indistinct. These partial regions may be continuous with each other.

As shown in FIG. 1, the photoelectric conversion element 110 may further include a second conductive layer-side intermediate layer 32. The second conductive layer-side intermediate layer 32 is located between the photoelectric conversion layer 10 and the second conductive layer 22. For example, the third partial region 13 may contact the second conductive layer-side intermediate layer 32. For example, the second conductive layer-side intermediate layer 32 may function as an electron transport layer.

As shown in FIG. 1, the photoelectric conversion element 110 may further include a first conductive layer-side intermediate layer 31. The first conductive layer-side intermediate layer 31 is located between the first conductive layer 21 and the photoelectric conversion layer 10. For example, the first partial region 11 may contact the first conductive layer-side intermediate layer 31. For example, the first conductive layer-side intermediate layer 31 may function as a hole transport layer.

As shown in FIG. 1, the photoelectric conversion layer 10 may include a first surface 10a and a second surface 10b. The second surface 10b is between the first surface 10a and the second conductive layer 22. The first surface 10a is a surface on the first conductive layer 21 side. The second surface 10b is a surface on the second conductive layer 22 side. The first partial region 11 may include the first surface 10a. The third partial region 13 may include the second surface 10b.

For example, a base body 25 may be included. In one example, the base body 25 includes, for example, an inorganic material. The base body 25 may be, for example, a glass substrate, etc. In the other example, the base body 25 includes an organic material. The base body 25 includes, for example, at least one selected from the group consisting of polyethylene, polyethylene terephthalate, and polyethylene naphthalate. The first conductive layer 21, the photoelectric conversion layer 10, and the second conductive layer 22 are located on the base body 25.

A first direction from the first conductive layer 21 toward the second conductive layer 22 is taken as a Z-axis direction. One direction perpendicular to the Z-axis direction is taken as an X-axis direction. A direction perpendicular to the Z-axis direction and the X-axis direction is taken as a Y-axis direction. The first conductive layer 21, the second conductive layer 22, the photoelectric conversion layer 10, the first conductive layer-side intermediate layer 31, the second conductive layer-side intermediate layer 32, and the base body 25 spread along the X-Y plane.

For example, light is incident on the photoelectric conversion layer 10 through one of the first conductive layer 21 side or the second conductive layer 22 side. The light is converted into an electrical signal in the photoelectric conversion layer 10.

Figure 2:
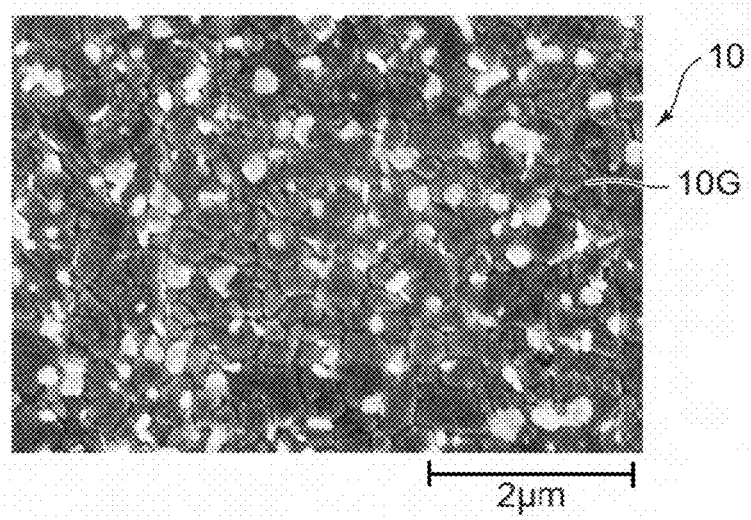
FIG. 2 is an electron microscope photograph illustrating the photoelectric conversion element according to the first embodiment.

FIG. 2 is an electron microscope photograph illustrating the photoelectric conversion element according to the first embodiment.

FIG. 2 is a SEM (Scanning Electron Microscope) image of the photoelectric conversion layer 10. As shown in FIG. 2, the photoelectric conversion layer 10 may include multiple crystal grains 10G. One of the multiple crystal grains 10G has a perovskite structure. Each of the multiple crystal grains 10G has a perovskite structure. The perovskite structure includes Sn and Pb. For example, the structure that includes the multiple crystal grains 10G can be formed by coating, etc. The size (e.g., the length along one direction) of one of the multiple crystal grains 10G is, for example, not less than about 100 nm and not more than about 3 μm. A large-area photoelectric conversion element is easily obtained.

According to the embodiment, the compositions (the concentrations) of the elements in the photoelectric conversion layer 10 change along the first direction. Examples of the changes of the concentrations of the elements will now be described.

Figure 3A:
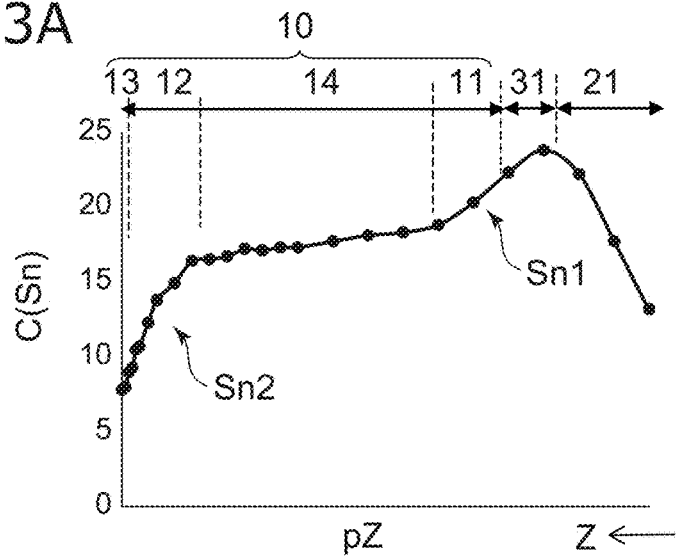
FIGS. 3A to 3C are graphs illustrating the photoelectric conversion element according to the first embodiment.
Figure 3B:
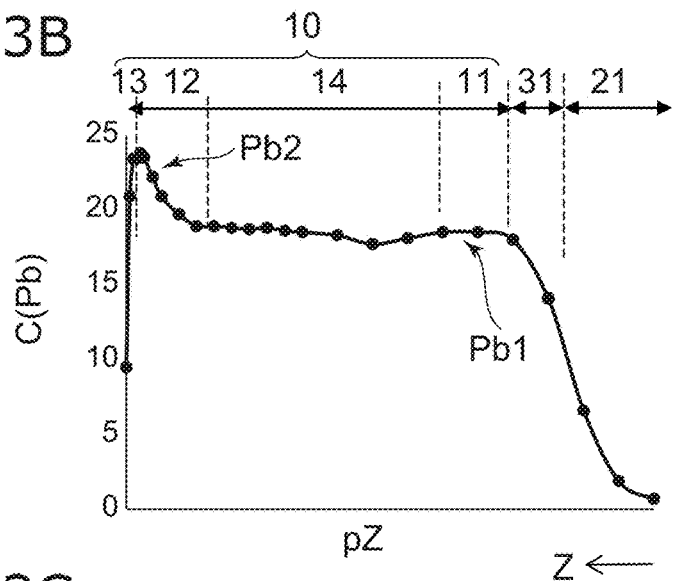
Figure 3C:
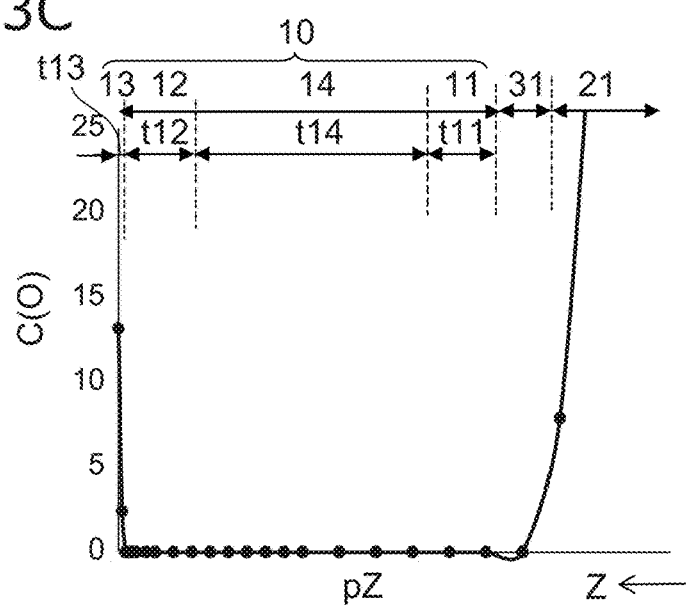

FIGS. 3A to 3C are graphs illustrating the photoelectric conversion element according to the first embodiment.

In these figures, the horizontal axis is a position pZ in the Z-axis direction. The vertical axis of FIG. 3A is a concentration C(Sn) of Sn. The vertical axis of FIG. 3B is a concentration C(Pb) of Pb. The concentration of FIG. 3C is a concentration C(O) of oxygen. These figures are based on analysis results of XPS (X-ray Photoelectron Spectroscopy). In the samples, the first conductive layer 21 is ITO (Indium-Tin Oxide). The first conductive layer-side intermediate layer 31 is an organic film.

As shown in FIG. 3A, the concentration C(Sn) of Sn changes along the Z-axis direction. As shown in FIG. 3B, the concentration C(Pb) of Pb changes along the Z-axis direction. As shown in FIG. 3C, the concentration C(O) of oxygen is locally high in the third partial region 13.

As shown in FIGS. 3A and 3B, for example, the first partial region 11 includes a first Sn concentration Sn1 and a first Pb concentration Pb1. For example, the second partial region 12 includes a second Sn concentration Sn2 and a second Pb concentration Pb2. For example, the second Sn concentration Sn2 is less than the first Sn concentration Sn1. For example, the second Pb concentration Pb2 is greater than the first Pb concentration Pb1. Thus, the second partial region 12 includes at least one of the second Sn concentration Sn2 that is less than the first Sn concentration Sn1, or the second Pb concentration Pb2 that is greater than the first Pb concentration Pb1.

As shown in FIGS. 3A to 3C, the third partial region 13 includes Sn, oxygen, and Pb.

Figure 4A:
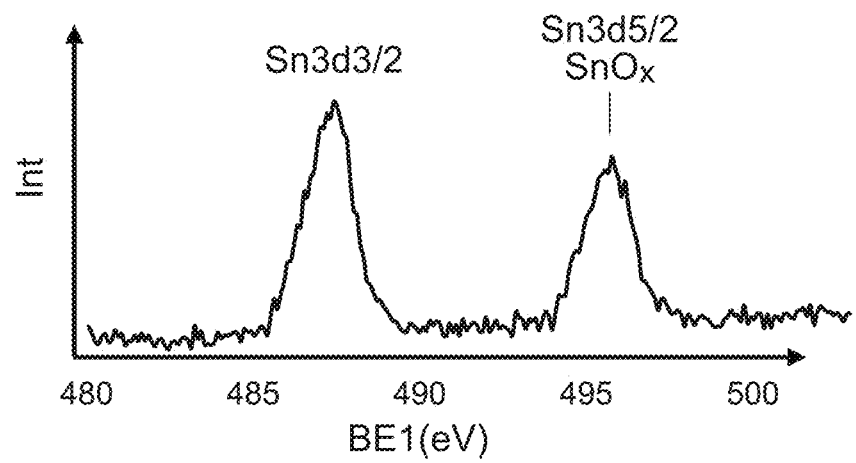
FIGS. 4A and 4B are graphs illustrating the photoelectric conversion element according to the first embodiment.
Figure 4B:
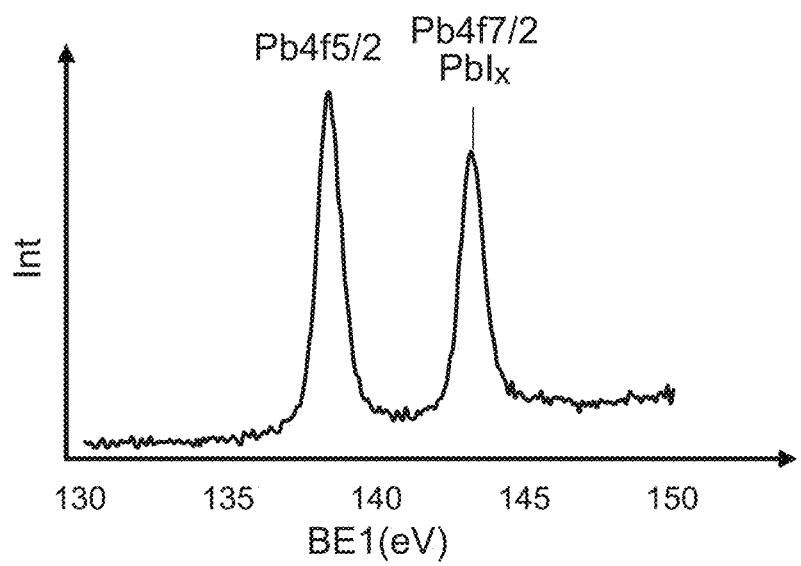

FIGS. 4A and 4B are graphs illustrating the photoelectric conversion element according to the first embodiment.

These figures illustrate XPS analysis results of the third partial region 13. In these figures, the horizontal axis is a binding energy BE1. The vertical axis is an intensity Int (e.g., counts/sec) of the signal.

As shown in FIG. 4A, a peak is observed in the range that is not less than 494.0 eV and not more than 497.0 eV. The peak corresponds to a bond of Sn and oxygen. A peak may be observed in the range that is not less than 485.0 eV and not more than 488.0 eV. The third partial region 13 includes tin oxide ($SnO_x$).

As shown in FIG. 4B, peaks are observed in the range that is not less than 137.5 and not more than 139.0 eV and the range that is not less than 142.5 eV and not more than 144.0 eV. These peaks correspond to Pb. The peak in the range that is not less than 142.5 eV and not more than 144.0 eV corresponds to a bond of Pb and iodine. The third partial region 13 includes Pb. The third partial region 13 includes lead iodide.

Figure 5A:
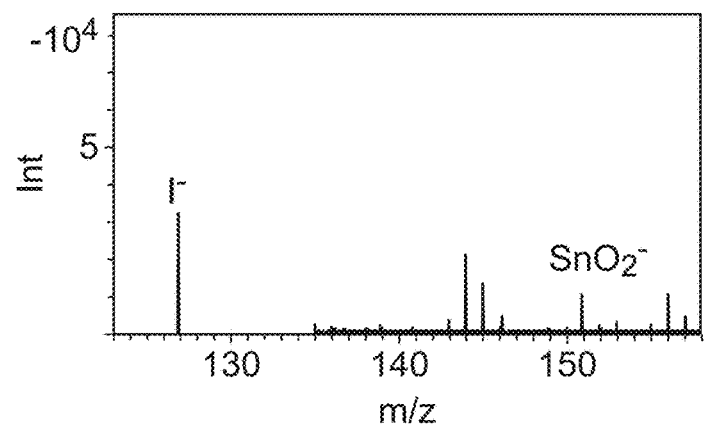
FIGS. 5A and 5B are graphs illustrating the photoelectric conversion element according to the first embodiment.
Figure 5B:
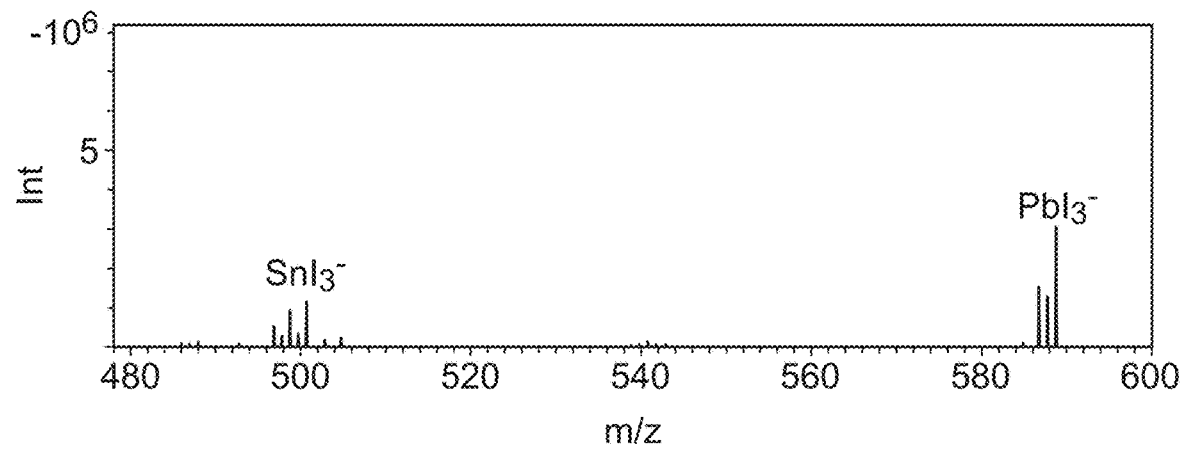

FIGS. 5A and 5B are graphs illustrating the photoelectric conversion element according to the first embodiment.

These figures illustrate analysis results of TOF-SIMS (Time-of-Flight Secondary Ion Mass Spectrometry) of the third partial region 13. In these figures, the horizontal axis is a mass-to-charge ratio m/z. The vertical axis is the intensity Int (e.g., counts) of the signal.

As shown in FIG. 5A, a peak is observed at a mass-to-charge ratio m/z of 152. The peak corresponds to tin oxide ($SnO_2$). A signal (a peak corresponding to SnO) may be observed at a mass-to-charge ratio m/z of 136. The third partial region 13 includes tin oxide ($SnO_x$).

As shown in FIG. 5B, multiple peaks are observed in a range of the mass-to-charge ratio m/z that is not less than 584 and not more than 590. These peaks correspond to lead iodide ($PbI_3$). Multiple signals (corresponding to $PbI_2$) may be observed in a range of the mass-to-charge ratio m/z that is not less than 457 and not more than 463. Multiple signals (corresponding to PbI) may be observed in a range of the mass-to-charge ratio m/z that is not less than 330 and not more than 336.

For example, information that relates to the third partial region 13 may be obtained by XPS analysis. For example, information that relates to the third partial region 13 may be obtained by TOF-SIMS analysis.

Thus, the third partial region 13 includes Sn, oxygen, and Pb. It was found that a high conversion efficiency is obtained for the photoelectric conversion layer 10 that has such a configuration.

For example, it is considered that the characteristics of the perovskite compound are changed by changing the composition ratio of Sn and Pb. For example, it is considered that at least one of the bandgap, the ionization potential, or the electron affinity is changed by changing the composition ratio of Sn and Pb. The ionization potential corresponds to the absolute value of the difference between the vacuum level and the energy level of the valence band. The electron affinity corresponds to the absolute value of the difference between the vacuum level and the energy level of the conduction band. For example, it is considered that the ionization potential and the electron affinity are reduced by increasing the Sn concentration.

For example, the holes that are generated by photoexcitation efficiently and easily move toward the first conductive layer 21 due to the profiles illustrated in FIGS. 3A and 3B. For example, it is considered that the electrons that are generated by photoexcitation efficiently and easily move toward the second conductive layer 22. The current extraction efficiency is increased thereby. For example, the short-circuit current density is increased. The conversion efficiency is increased thereby.

The third partial region 13 includes tin oxide in addition to the structure that includes Pb. The tin oxide can function as an n-type semiconductor. It is considered that because the third partial region 13 includes tin oxide, for example, the electrons that are generated by photoexcitation move more easily toward the second conductive layer 22. For example, the short-circuit current density is increased. A high conversion efficiency is obtained thereby. According to the embodiment, a photoelectric conversion element can be provided in which the characteristics can be improved. At least a portion of the tin oxide included in the third partial region 13 may be, for example, amorphous. At least a portion of the tin oxide included in the third partial region 13 may include, for example, a crystal.

For example, the tin oxide and such an element profile can be formed by supplying a gas including oxygen to the surface when forming the photoelectric conversion layer 10 by coating. As described above, the photoelectric conversion layer 10 includes the multiple crystal grains 10G. A structure that includes oxygen and tin may be formed at the surface of each of the multiple crystal grains 10G in the third partial region 13. For example, a higher efficiency is easily obtained thereby.

For example, there is a reference example of a photoelectric conversion layer that is single-crystal perovskite. In the reference example, it may be considered to form a tin oxide layer as an electron transport layer after forming the single-crystal photoelectric conversion layer. In such a case, it is difficult for the tin oxide to penetrate the single-crystal photoelectric conversion layer. Therefore, a region in which the tin oxide and the Pb in the perovskite are detected is not formed.

A region (the third partial region 13) in which tin oxide and Pb are detected is unique to the photoelectric conversion layer 10 that includes the multiple crystal grains 10G.

As shown in FIG. 3A, a region (the third partial region 13) that includes oxygen may be locally provided. For example, the first partial region 11 does not include oxygen. Or, the oxygen concentration in the first partial region 11 is not more than 1/100 of the oxygen concentration in the third partial region 13. For example, the second partial region 12 does not include oxygen. Or, the oxygen concentration in the second partial region 12 is not more than 1/100 of the oxygen concentration in the third partial region 13. For example, a good crystal structure is easily maintained by the first and second partial regions 11 and 12 not including oxygen.

As shown in FIG. 3C, the thickness of the third partial region 13 along the first direction (the Z-axis direction) from the first conductive layer 21 toward the second conductive layer 22 is taken as a thickness t13. The thickness t13 may be thin. The thickness t13 is, for example, not less than 0.1% and not more than 5% of a thickness t10 of the photoelectric conversion layer 10 along the first direction (referring to FIG. 1). The thickness t13 of the third partial region 13 is, for example, not less than 1 nm and not more than 20 nm.

The thickness t13 of the third partial region 13 is less than a thickness t11 of the first partial region 11 along the first direction (the Z-axis direction). The thickness t13 is less than a thickness t12 of the second partial region 12 along the first direction (the Z-axis direction). As described above, the photoelectric conversion layer 10 may include the fourth partial region 14. The thickness t13 is less than a thickness t14 of the fourth partial region 14 along the first direction (the Z-axis direction).

As shown in FIG. 3A, the change rate of the concentration C(Sn) of Sn in the fourth partial region 14 with respect to the positional change in the first direction (the Z-axis direction) is less than the change rate of the concentration C(Sn) of Sn in the first partial region 11 with respect to the positional change in the first direction (the Z-axis direction). The change rate of the concentration C(Sn) of Sn in the fourth partial region 14 with respect to the positional change in the first direction (the Z-axis direction) is less than the change rate of the concentration C(Sn) of Sn in the second partial region 12 with respect to the positional change in the first direction (the Z-axis direction).

The change rate of the concentration C(Pb) of Pb in the fourth partial region 14 with respect to the positional change in the first direction (the Z-axis direction) is less than the change rate of the concentration C(Pb) of Pb in the second partial region 12 with respect to the positional change in the first direction (the Z-axis direction).

Figure 6:
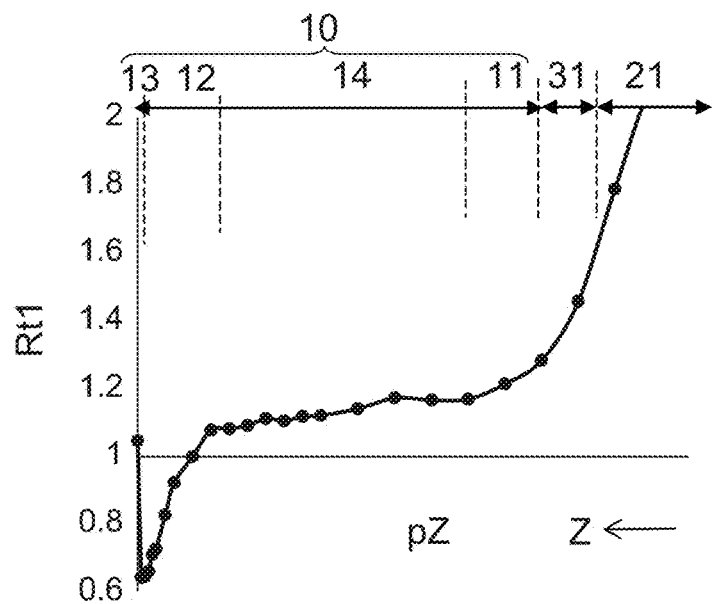
FIG. 6 is a graph illustrating the photoelectric conversion element according to the first embodiment.

FIG. 6 is a graph illustrating the photoelectric conversion element according to the first embodiment.

The horizontal axis of FIG. 6 is the position pZ in the Z-axis direction. The vertical axis of FIG. 6 is a ratio Rt1. The ratio of the average Sn concentration in the photoelectric conversion layer 10 to the average Pb concentration in the photoelectric conversion layer is taken as an average composition ratio Xave. The ratio of the concentration C(Sn) of Sn to the concentration C(Pb) of Pb at the position pZ is taken as a ratio X(pZ). The ratio Rt1 is the ratio of the ratio X(pZ) to the average composition ratio Xave. In the example, the average composition ratio Xave is 0.431.

As shown in FIG. 6, the ratio Rt1 in the first partial region 11 is greater than 1. The ratio Rt1 in the second partial region 12 is less than 1.

According to the embodiment, the ratio Rt1 of the Sn concentration to the Pb concentration in at least a portion of the first partial region 11 is not less than 1.2 times the average composition ratio Xave of the average Sn concentration in the photoelectric conversion layer 10 to the average Pb concentration in the photoelectric conversion layer 10.

The ratio Rt1 of the Sn concentration to the Pb concentration in at least a portion of the second partial region 12 is not more than 0.8 times the average composition ratio Xave of the average Sn concentration in the photoelectric conversion layer 10 to the average Pb concentration in the photoelectric conversion layer 10.

A high conversion efficiency is easily obtained by providing such a composition ratio profile.

Figure 7:
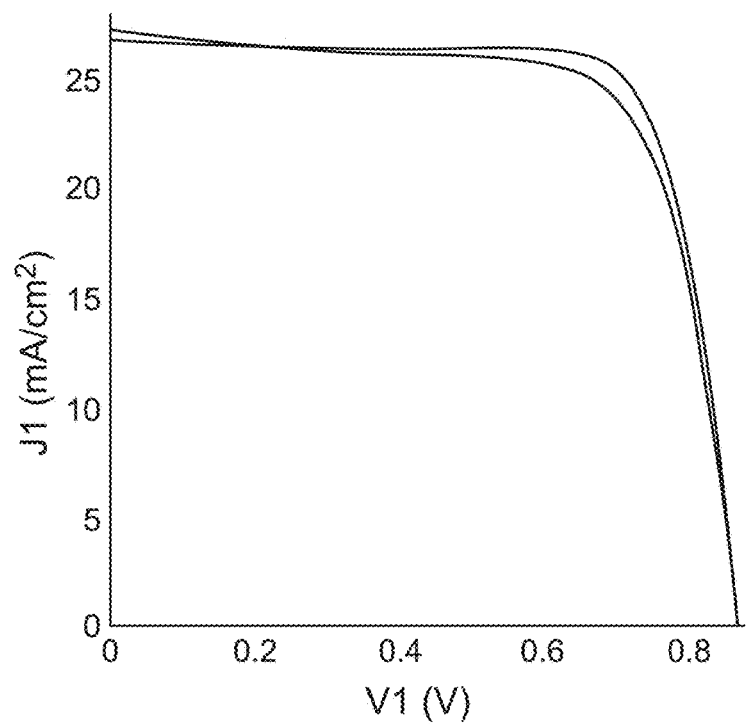
FIG. 7 is a graph illustrating characteristics of the photoelectric conversion element.
Figure 8:
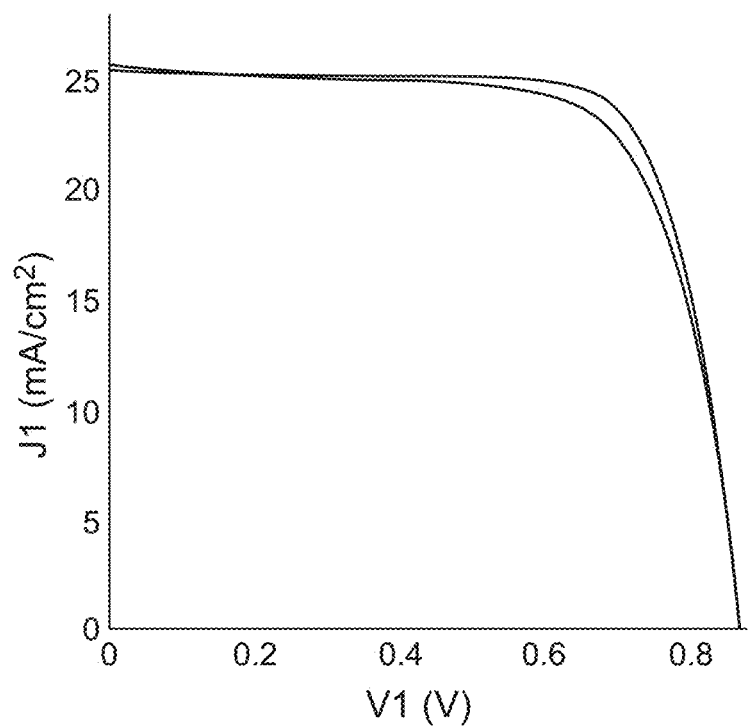
FIG. 8 is a graph illustrating characteristics of the photoelectric conversion element.

FIGS. 7 and 8 are graphs illustrating characteristics of the photoelectric conversion element.

FIG. 7 corresponds to a first sample. FIG. 8 corresponds to a second sample. In the first sample, the photoelectric conversion layer 10 has the configuration illustrated in FIGS. 3A to 3C. In the first sample, the photoelectric conversion layer 10 includes the first to fourth partial regions 11 to 14 described above. The third partial region 13 includes Sn, oxygen, and Pb. The third partial region 13 includes tin oxide. The first sample is formed by supplying a gas including oxygen toward a liquid film used to form the photoelectric conversion layer 10 after forming the liquid film by coating, and by subsequently solidifying.

In the second sample, the photoelectric conversion layer 10 does not include the third partial region 13 that includes Sn, oxygen, and Pb. The second sample is formed by supplying a gas that substantially does not include oxygen toward a liquid film used to form the photoelectric conversion layer 10 after forming the liquid film by coating, and by subsequently solidifying. In the first and second samples, the Sn concentration and the Pb concentration have the profiles illustrated in FIGS. 3A and 3B. In FIGS. 7 and 8, the horizontal axis is an applied voltage V1. The vertical axis is a current density J1.

In the first sample shown in FIG. 7, a conversion efficiency η is 17.8%. A short-circuit current density Isc is 26.8 mA/cm². An open-circuit voltage Voc is 0.87 V. A form factor FF is 0.76.

In the second sample shown in FIG. 8, the conversion efficiency η is 16.6%. The short-circuit current density Isc is 25.6 mA/cm². The open-circuit voltage Voc is 0.87 V. The form factor FF is 0.75.

It can be seen from the comparison of the first and second samples that a high conversion efficiency is obtained by providing the third partial region 13 that includes Sn, oxygen, and Pb.

According to the embodiment, the photoelectric conversion layer 10 includes at least one of a compound represented by $A^1BX^1_3$ or a compound represented by $A^2_2A^1_{m-1}B_mX^1_{3m+1}$. The "$A^1$" recited above is a monovalent cation that includes at least one selected from the group consisting of $Cs^+$, $Rb^+$, $K^+$, $Na^+$, $R^1NH_3^+$, $R^1_2NH_2^+$, and $HC(NH_2)_2^+$. The "$R^1$" in the "$A^1$" is at least one monovalent group selected from the group consisting of hydrogen, a linear alkyl group including not less than 1 and not more than 18 carbon atoms, a branched alkyl group including not less than 1 and not more than 18 carbon atoms, a cyclic alkyl group including not less than 1 and not more than 18 carbon atoms, a substituted aryl group, a non-substituted aryl group, a substituted heteroaryl group, and a non-substituted heteroaryl group. The "$A^2$" recited above is a monovalent cation that includes at least one selected from the group consisting of $R^1HN_3^+$, $R^1_2NH_2^+$, $C(NH_2)_3^+$, and $R^2C_2H_4NH_3^+$. The "$R^2$" in the "$A^2$" is at least one monovalent group selected from the group consisting of a substituted aryl group, a non-substituted aryl group, a substituted heteroaryl group, and a non-substituted heteroaryl group. "B" recited above is a divalent cation that includes at least one selected from the group consisting of $Pb_2^+$ and $Sn_2^+$. "B" recited above may further include $Ge_2$. The "$X^1$" recited above is at least one monovalent negative ion selected from the group consisting of $F^-$, $Cl^-$, $Br^-$, $I^-$, $SCN^-$, and $CH_3COO^-$. "m" recited above is an integer not less than 1 and not more than 20.

According to the embodiment, the photoelectric conversion layer 10 may further include the following first compound. The first compound includes, for example, at least one selected from the group consisting of a pyrrolidone derivative, a urea derivative, an imidazole derivative, a pyridine derivative, and a diamine derivative. For example, the first compound is included in a solution when forming the photoelectric conversion layer 10 by coating. Due to the first compound, gaps between the multiple crystal grains 10G of the perovskite compound are reduced or are substantially nil; and a dense crystal region is easily obtained. A high conversion efficiency is easily obtained.

According to the embodiment, the thickness t10 of the photoelectric conversion layer 10 (referring to FIG. 1) is, for example, not less than 30 nm and not more than 1000 nm. By setting the thickness t11 to be not less than 30 nm, for example, the light can be efficiently absorbed, and a high short-circuit current density is obtained. By setting the thickness t11 to be not more than 1000 nm, for example, an excessively long carrier transport distance is suppressed. For example, the reduction of the conversion efficiency can be suppressed.

A thickness t31 of the first conductive layer-side intermediate layer 31 (referring to FIG. 1) is, for example, not less than 1 nm and not more than 200 nm. A thickness t32 of the second conductive layer-side intermediate layer 32 (referring to FIG. 1) is, for example, not less than 1 nm and not more than 200 nm. The thickness t11, the thickness t31, and the thickness t32 are lengths along the Z-axis direction.

The second conductive layer-side intermediate layer 32 includes, for example, at least one selected from the group consisting of polyaniline, a polyaniline derivative, polythiophene, a polythiophene derivative, polyethylene dioxythiophene:polystyrenesulfonic acid (PEDOT:PSS), polyethyleneimine, a polyethyleneimine derivative, fullerene, a fullerene derivative, titanium oxide, zinc oxide, molybdenum oxide, tungsten oxide, aluminum oxide, copper oxide, vanadium oxide, nickel oxide, lithium oxide, calcium oxide, cesium oxide, copper iodide, copper thiocyanate, lithium fluoride (LiF), and metal calcium.

The first conductive layer-side intermediate layer 31 includes, for example, at least one selected from the group consisting of polyaniline, a polyaniline derivative, polythiophene, a polythiophene derivative, and polyethylene dioxythiophene:polystyrenesulfonic acid (PEDOT:PSS). The first conductive layer-side intermediate layer 31 may include, for example, fullerene. The first conductive layer-side intermediate layer 31 may include, for example, at least one selected from the group consisting of polyethyleneimine, a polyethyleneimine derivative, a fullerene derivative, titanium oxide, zinc oxide, molybdenum oxide, tungsten oxide, aluminum oxide, copper oxide, vanadium oxide, nickel oxide, lithium oxide, calcium oxide, cesium oxide, copper iodide, copper thiocyanate, lithium fluoride (LiF), and metal calcium.

For example, the first conductive layer-side intermediate layer 31 and the second conductive layer-side intermediate layer 32 can be formed by at least one of vapor deposition or printing.

The first conductive layer 21 includes, for example, a metal oxide. The metal oxide includes, for example, oxygen and at least one selected from the group consisting of indium, zinc, and tin. The first conductive layer 21 may include, for example, at least one selected from the group consisting of gold, platinum, silver, copper, cobalt, nickel, indium, and aluminum. In one example, the light transmittance of the first conductive layer 21 is greater than the light transmittance of the second conductive layer 22. The light transmittance may be, for example, the transmittance for visible light.

The second conductive layer 22 includes, for example, at least one selected from the group consisting of silver, gold, aluminum, copper, titanium, platinum, nickel, tin, zinc, chrome, and lithium. The second conductive layer 22 may include, for example, a metal oxide. The second conductive layer 22 may include, for example, at least one selected from the group consisting of a conductive polymer, graphene, and a carbon nanotube.

For example, the base body 25 may be light-transmissive. The base body 25 may include, for example, at least one selected from the group consisting of a resin and glass. The surface of the base body 25 may include an unevenness. The light from the outside can be caused to be efficiently incident.

Second Embodiment

Figure 9:
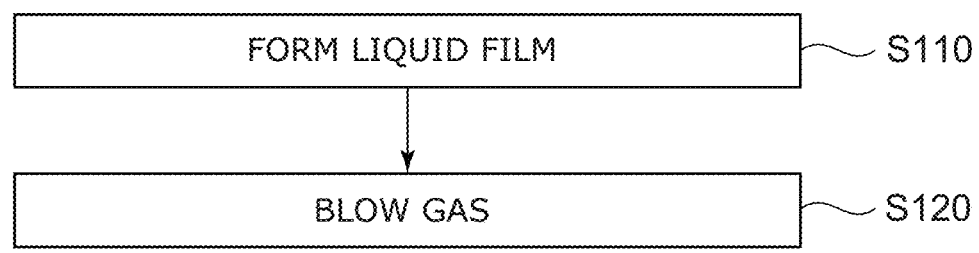
FIG. 9 is a flowchart illustrating a method for manufacturing a photoelectric conversion element according to a second embodiment.

FIG. 9 is a flowchart illustrating a method for manufacturing a photoelectric conversion element according to a second embodiment.

Figure 10:
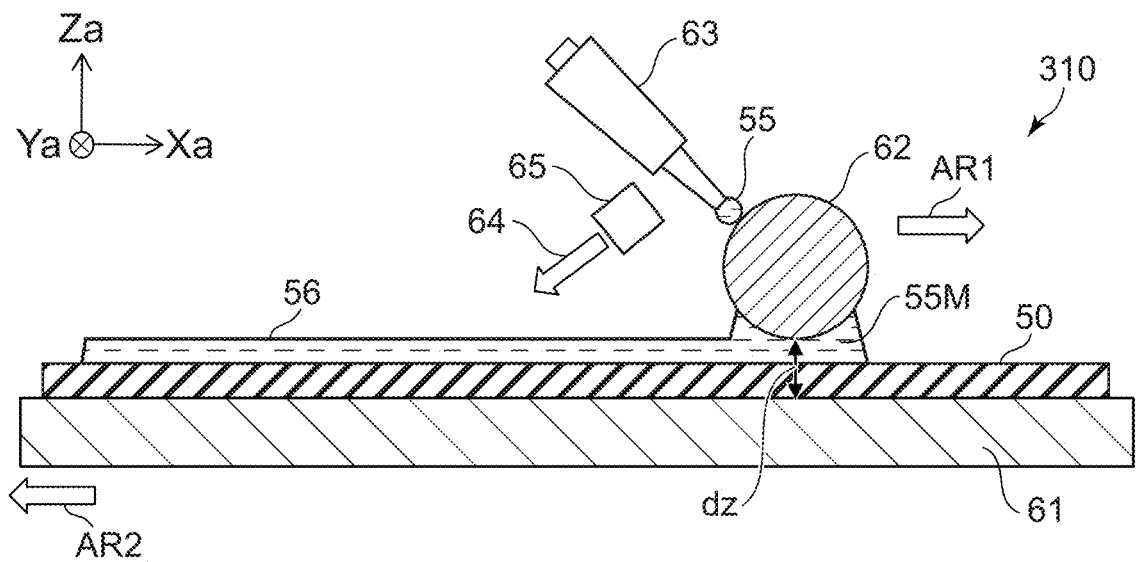
FIG. 10 is a schematic side view illustrating a coating apparatus used in the method for manufacturing the photoelectric conversion element according to the second embodiment.

FIG. 10 is a schematic side view illustrating a coating apparatus used in the method for manufacturing the photoelectric conversion element according to the second embodiment.

As shown in FIG. 10, a coating apparatus 310 includes, for example, a supporter 61, a coating bar 62, a coating liquid supplier 63, and a gas supplier 65. The supporter 61 is configured to support a coated body 50. The coated body 50 includes, for example, the base body 25 and the first conductive layer 21. The coated body 50 may further include the first conductive layer-side intermediate layer 31. Coating is performed onto the surface of the coated body 50. The supporter 61 may be, for example, a stage, etc. In the example, the coating bar 62 is located above the supporter 61.

The coating liquid supplier 63 supplies a coating liquid 55 toward at least one of the coating bar 62 or the coated body 50. The coating liquid supplier 63 is configured to coat the coating liquid 55 onto the coated body 50 by forming a meniscus 55M that includes the coating liquid 55 between the coating bar 62 and the coated body 50. The coating liquid supplier 63 may include, for example, a syringe, etc.

For example, the coating bar 62 is movable relative to the supporter 61 (i.e., the coated body 50) along arrow AR1. The supporter 61 (i.e., the coated body 50) may be movable relative to the coating bar 62 along arrow AR2. The coating liquid 55 of the meniscus 55M is coated onto the coated body 50 according to the movement. Thereby, a coated film 56 is formed of the coating liquid 55 on the surface of the coated body 50.

The gas supplier 65 is configured to supply a gas 64 toward the coating liquid 55 (i.e., the coated film 56) coated onto the coated body 50. The solvent in the coated film 56 is vaporized by the gas 64; and the coated film 56 is solidified. Subsequently, heat treatment, etc., may be performed as necessary. Thereby, a layer (e.g., the photoelectric conversion layer 10) is obtained based on the coating liquid 55.

According to the method for manufacturing the photoelectric conversion element according to the embodiment as shown in FIG. 9, the coating liquid 55 is coated onto the coated body 50 (step S110). The coating liquid 55 includes a solvent that the perovskite precursor that is used to form the photoelectric conversion layer 10. It is favorable for the coating liquid 55 to include the first compound described above. When coating, the coating liquid 55 is coated onto the coated body 50 by forming the meniscus 55M that includes such a coating liquid 55 between the coating bar 62 and the coated body 50.

According to the method for manufacturing the photoelectric conversion element according to the embodiment, the gas 64 is supplied toward the coating liquid 55 coated onto the coated body 50 (i.e., the coated film 56) (step S120). The photoelectric conversion layer 10 is formed from the coating liquid 55.

By supplying the gas 64 that includes oxygen to the coated film 56 and the third partial region 13 that includes Sn, oxygen, and Pb can be formed.

In addition to oxygen, the gas 64 includes at least one selected from the group consisting of nitrogen, helium, neon, argon, and air.

According to the embodiment, the flow velocity of the gas 64 is, for example, not less than 4 m/s. The "flow velocity of the gas 64" is defined as the maximum air velocity of the gas 64 supplied toward the coated film 56. For example, the maximum air velocity of the gas 64 at the vicinity of the surface of the coating liquid 55 is not less than 4 m/s. According to the method for manufacturing the photoelectric conversion element according to the embodiment, the photoelectric conversion layer 10 is formed from the coating liquid 55.

For example, the occurrence of gaps between the multiple crystal regions can be suppressed by a flow velocity that is not less than 4 ms/s. For example, a dense photoelectric conversion layer 10 is easily obtained.

Figure 11:
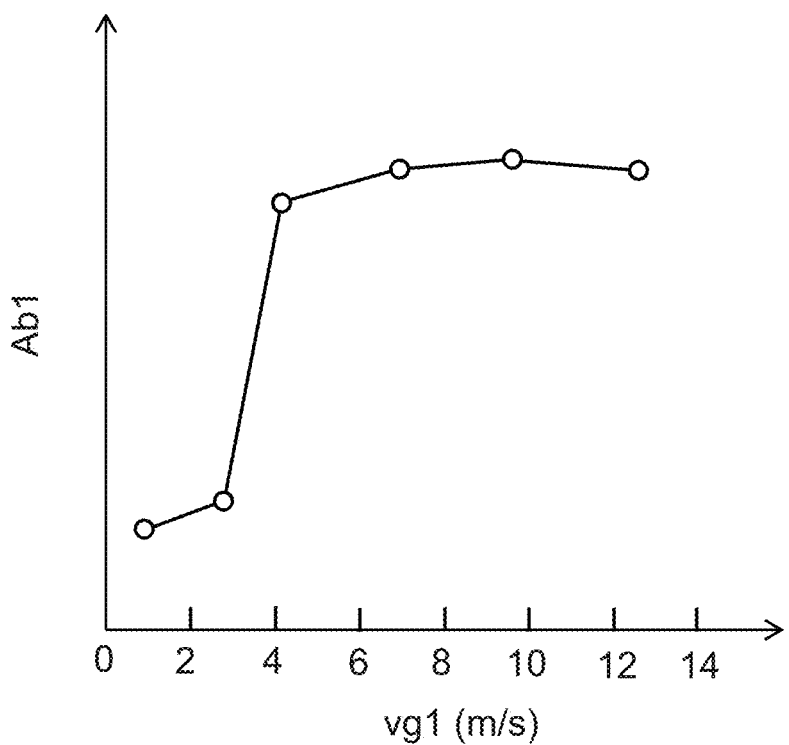
FIG. 11 is a graph illustrating a characteristic relating to the method for manufacturing the photoelectric conversion element.

FIG. 11 is a graph illustrating a characteristic relating to the method for manufacturing the photoelectric conversion element.

The horizontal axis of FIG. 11 is a flow velocity vg1 of the gas 64. The vertical axis is an absorbance Ab1 of the photoelectric conversion layer 10 for a wavelength of 700 nm. A high absorbance Ab1 corresponds to small gaps between the multiple crystal regions in the photoelectric conversion layer 10. As shown in FIG. 11, the absorbance Ab1 is low when the flow velocity vg1 is less than 4 m/s. A high absorbance Ab1 is obtained when the flow velocity vg1 is not less than 4 m/s. According to the embodiment, for example, it is favorable for the flow velocity vg1 to be not less than 4 m/s, more favorably 6 m/s, and more favorably not less than 8 m/s. The flow velocity vg1 is, for example, not more than 40 m/s. It is more favorable for the flow velocity vg1 to be not more than 30 m/s, and more favorably not more than 25 m/s. By setting the flow velocity vg1 to be not more than 40 m/s, for example, scattering of the coating liquid 55 can be suppressed.

The boiling point of the solvent is, for example, not more than 200° C. The boiling point may be not more than 165° C. The boiling point may be not more than 140° C. For example, the occurrence of gaps between the multiple crystal regions can be suppressed thereby. For example, a dense photoelectric conversion layer 10 is easily obtained.

According to the embodiment, the coating of the coating liquid 55 onto the coated body 50 includes relatively moving the coated body 50 and the coating bar 62. The rate of the relative movement is, for example, not less than 20 mm/s. For example, high productivity is obtained by setting the rate of the relative movement to be not less than 20 mm/s. The rate of the relative movement may be not more than 200 mm/s. An excessive supply of the coating liquid 55 onto the coated body 50 is suppressed thereby, and, for example, a delay of the drying of the solvent can be suppressed. For example, when the rate of the relative movement is greater than 200 mm/s, the flatness is poor, and the gaps between the crystal regions are highly noticeable.

As shown in FIG. 10, the orientation of the supply of the gas 64 is along the relative movement direction of the coated body 50. For example, a uniform coated film 56 is easily obtained.

According to the embodiment, the first compound includes, for example, at least one selected from the group consisting of a pyrrolidone derivative, a urea derivative, an imidazole derivative, a pyridine derivative, and a diamine derivative. A uniform and stable coating liquid 55 is obtained thereby. For example, a high conversion efficiency is obtained in the photoelectric conversion layer 10 that is formed from the coating liquid 55. According to the embodiment, a method for manufacturing a photoelectric conversion element can be provided in which the characteristics of the photoelectric conversion element can be improved.

As shown in FIG. 10, the distance (e.g., the shortest distance) between the supporter 61 and the coating bar 62 is taken as a distance dz. The distance dz may be modifiable according to the relative movement of the coating bar 62 and the coated body 50. For example, the distance dz may change between the end portion of the coating region and the central portion of the coating region. The thickness of the coated film 56 can be more uniform thereby.

For example, the direction from the supporter 61 toward the coating bar 62 is taken as a Za-direction. One direction perpendicular to the Za-direction is taken as an Xa-direction. A direction perpendicular to the Za-direction and the Xa-direction is taken as a Ya-direction. The distance dz is the length along the Za-direction. The direction of the relative movement (e.g., arrow AR1 or arrow AR2) is along the Xa-direction.

According to the embodiment, the coating liquid 55 includes, for example, lead iodide ($PbI_2$) (231 mg), tin iodide ($SnI_2$) (186 mg), methylammonium iodide ($CH_3NH_3I:MAI$) (152 mg), N-methylpyrrolidone (20 mg), acetone (0.63 mL), and N,N-dimethylformamide (0.42 mL). Lead iodide ($PbI_2$), tin iodide ($SnI_2$), and methylammonium iodide ($CH_3NH_3I:MAI$) are examples of the perovskite precursor that is used to form the photoelectric conversion layer 10.

For example, the photoelectric conversion element according to the embodiment is applicable to a solar cell, a light-emitting element, a light sensor, etc. For example, a perovskite compound is used as the photoelectric conversion material of the photoelectric conversion element. For example, a photoelectric conversion layer that has a large area is inexpensively obtained by forming the photoelectric conversion layer by coating. According to the embodiment, the solution of the perovskite compound can be coated in one step.

Embodiments may include the following configurations (e.g., technological proposals).

Configuration 1

A photoelectric conversion element, comprising:
a first conductive layer;
a second conductive layer; and
a photoelectric conversion layer located between the first conductive layer and the second conductive layer,
the photoelectric conversion layer including Sn and Pb,
the photoelectric conversion layer including
a first partial region,
a second partial region between the first partial region and the second conductive layer, and
a third partial region between the second partial region and the second conductive layer,
the first partial region including a first Sn concentration and a first Pb concentration,
the second partial region including at least one of a second Sn concentration or a second Pb concentration,
the second Sn concentration being less than the first Sn concentration,
the second Pb concentration being greater than the first Pb concentration,
the third partial region including Sn, oxygen, and Pb.

Configuration 2

The photoelectric conversion element according to Configuration 1, wherein
the third partial region includes a bond of Sn and oxygen.

Configuration 3

The photoelectric conversion element according to Configuration 1 or 2, wherein
the third partial region includes a bond of Pb and iodine.

Configuration 4

The photoelectric conversion element according to any one of Configurations 1 to 3, wherein
the photoelectric conversion layer includes a plurality of crystal grains.

Configuration 5

The photoelectric conversion element according to Configuration 4, wherein
one of the plurality of crystal grains has a perovskite structure.

Configuration 6

The photoelectric conversion element according to any one of Configurations 1 to 5, wherein
a ratio of a Sn concentration to a Pb concentration in at least a portion of the first partial region is not less than 1.2 times an average composition ratio of an average Sn concentration in the photoelectric conversion layer to an average Pb concentration in the photoelectric conversion layer.

Configuration 7

The photoelectric conversion element according to any one of Configurations 1 to 5, wherein
a ratio of a Sn concentration to a Pb concentration in at least a portion of the second partial region is not more than 0.8 times an average composition ratio of an average Sn concentration in the photoelectric conversion layer to an average Pb concentration in the photoelectric conversion layer.

Configuration 8

The photoelectric conversion element according to any one of Configurations 1 to 7, wherein
the photoelectric conversion layer further includes a fourth partial region between the first partial region and the second partial region,
a change rate of a Sn concentration with respect to a positional change in a first direction in the fourth partial region is less than a change rate of a Sn concentration with respect to a positional change in the first direction in the first partial region,
the first direction is from the first conductive layer toward the second conductive layer, and
the change rate of the Sn concentration with respect to the positional change in the first direction in the fourth partial region is less than a change rate of a Sn concentration with respect to a positional change in the first direction in the second partial region.

Configuration 9

The photoelectric conversion element according to any one of Configurations 1 to 5, wherein
the first partial region does not include oxygen, or an oxygen concentration in the first partial region is not more than 1/100 of an oxygen concentration in the third partial region, and
the second partial region does not include oxygen, or an oxygen concentration in the second partial region is not more than 1/100 of the oxygen concentration in the third partial region.

Configuration 10

The photoelectric conversion element according to any one of Configurations 1 to 9, wherein
a thickness of the third partial region along a first direction is not less than 0.1% and not more than 5% of a thickness of the photoelectric conversion layer along the first direction, and
the first direction is from the first conductive layer toward the second conductive layer.

Configuration 11

The photoelectric conversion element according to any one of Configurations 1 to 9, wherein
a thickness of the third partial region along a first direction is not less than 1 nm and not more than 20 nm, and
the first direction is from the first conductive layer toward the second conductive layer.

Configuration 12

The photoelectric conversion element according to any one of Configurations 1 to 9, wherein
a thickness of the third partial region along a first direction is less than a thickness of the first partial region along the first direction and less than a thickness of the second partial region along the first direction, and
the first direction is from the first conductive layer toward the second conductive layer.

Configuration 13

The photoelectric conversion element according to any one of Configurations 1 to 12, further comprising:
a second conductive layer-side intermediate layer located between the photoelectric conversion layer and the second conductive layer,
the third partial region contacting the second conductive layer-side intermediate layer.

Configuration 14

The photoelectric conversion element according to Configuration 13, wherein
the second conductive layer-side intermediate layer includes at least one selected from the group consisting of polyaniline, a polyaniline derivative, polythiophene, a polythiophene derivative, polyethylene dioxythiophene:polystyrenesulfonic acid (PEDOT:PSS), polyethyleneimine, a polyethyleneimine derivative, fullerene, a fullerene derivative, titanium oxide, zinc oxide, molybdenum oxide, tungsten oxide, aluminum oxide, copper oxide, vanadium oxide, nickel oxide, lithium oxide, calcium oxide, cesium oxide, copper iodide, copper thiocyanate, lithium fluoride (LiF), and metal calcium.

Configuration 15

The photoelectric conversion element according to any one of Configurations 1 to 14, wherein
the photoelectric conversion layer includes at least one of a compound expressed by $A^1BX^1_3$ or a compound expressed by $A^2_2A^1_{m-1}B_mX^1_{3m+1}$,
the $A^1$ is a monovalent cation including at least one selected from the group consisting of $Cs^+$, $Rb^+$, $K^+$, $Na^+$, $R^1NH_3^+$, $R^1_2NH_2^+$, and $HC(NH_2)_2^+$,
the $R^1$ in the $A^1$ is at least one monovalent group selected from the group consisting of hydrogen, a linear alkyl group including not less than 1 and not more than 18 carbon atoms, a branched alkyl group including not less than 1 and not more than 18 carbon atoms, a cyclic alkyl group including not less than 1 and not more than 18 carbon atoms, a substituted aryl group, a non-substituted aryl group, a substituted heteroaryl group, and a non-substituted heteroaryl group,
the $A^2$ is a monovalent cation including at least one selected from the group consisting of $R^1HN_3^+$, $R^1_2NH_2^+$, $C(NH_2)_3^+$, and $R^2C_2H_4NH_3^+$,
the $R^2$ in the $A^2$ is at least one monovalent group selected from the group consisting of a substituted aryl group, a non-substituted aryl group, a substituted heteroaryl group, and a non-substituted heteroaryl group,
the B is a divalent cation including at least one selected from the group consisting of $Pb_2^+$ and $Sn_2^+$,
the $X^1$ is at least one monovalent negative ion selected from the group consisting of $F^-$, $Cl^-$, $Br^-$, $I^-$, $SCN^-$, and $CH_3COO^-$, and
m is an integer not less than 1 and not more than 20.

Configuration 16

A method for manufacturing a photoelectric conversion element, comprising:
coating a coating liquid onto a coated body by forming a meniscus between a coating bar and the coated body, the meniscus including the coating liquid,
the coating liquid including a perovskite precursor and a solvent,
the perovskite precursor being used to form a photoelectric conversion layer; and
forming the photoelectric conversion layer from the coating liquid by supplying a gas including oxygen toward the coating liquid coated onto the coated body.

Configuration 17

The method for manufacturing the photoelectric conversion element according to Configuration 16, wherein
the gas includes at least one selected from the group consisting of nitrogen, helium, neon, argon, and air.

Configuration 18

The method for manufacturing the photoelectric conversion element according to Configuration 16 or 17, wherein a boiling point of the solvent is not more than 200° C.

Configuration 19

The method for manufacturing the photoelectric conversion element according to any one of Configurations 16 to 18, wherein
the coating of the coating liquid onto the coated body includes relatively moving the coated body and the coating bar, and
a rate of the relative movement is not less than 20 mm/s.

Configuration 20

The method for manufacturing the photoelectric conversion element according to any one of Configurations 16 to 19, wherein
an orientation of the supply of the gas is along a relative movement direction of the coated body.

According to embodiments, a photoelectric conversion element and a method for manufacturing the photoelectric conversion element can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in photoelectric conversion elements such as conductive layers, photoelectric conversion layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all photoelectric conversion elements, and methods for manufacturing photoelectric conversion elements practicable by an appropriate design modification by one skilled in the art based on the photoelectric conversion elements, and the methods for manufacturing photoelectric conversion elements described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A photoelectric conversion element, comprising:
   a first conductive layer;
   a second conductive layer; and
   a photoelectric conversion layer located between the first conductive layer and the second conductive layer,
   the photoelectric conversion layer including Sn and Pb,
   the photoelectric conversion layer including
      a first partial region,
      a second partial region between the first partial region and the second conductive layer, and
      a third partial region between the second partial region and the second conductive layer,
   the first partial region including a first Sn concentration and a first Pb concentration,
   the second partial region including at least one of a second Sn concentration or a second Pb concentration,
   the second Sn concentration being less than the first Sn concentration,
   the second Pb concentration being greater than the first Pb concentration,
   the third partial region including Sn, oxygen, and Pb.

2. The element according to claim 1, wherein
   the third partial region includes a bond of Sn and oxygen.

3. The element according to claim 1, wherein
   the third partial region includes a bond of Pb and iodine.

4. The element according to claim 1, wherein
   the photoelectric conversion layer includes a plurality of crystal grains.

5. The element according to claim 4, wherein
   one of the plurality of crystal grains has a perovskite structure.

6. The element according to claim 1, wherein
   a ratio of a Sn concentration to a Pb concentration in at least a portion of the first partial region is not less than 1.2 times an average composition ratio of an average Sn concentration in the photoelectric conversion layer to an average Pb concentration in the photoelectric conversion layer.

7. The element according to claim 1, wherein
   a ratio of a Sn concentration to a Pb concentration in at least a portion of the second partial region is not more than 0.8 times an average composition ratio of an average Sn concentration in the photoelectric conversion layer to an average Pb concentration in the photoelectric conversion layer.

8. The element according to claim 1, wherein
   the photoelectric conversion layer further includes a fourth partial region between the first partial region and the second partial region,
   a change rate of a Sn concentration with respect to a positional change in a first direction in the fourth partial region is less than a change rate of a Sn concentration with respect to a positional change in the first direction in the first partial region,
   the first direction is from the first conductive layer toward the second conductive layer, and
   the change rate of the Sn concentration with respect to the positional change in the first direction in the fourth partial region is less than a change rate of a Sn concentration with respect to a positional change in the first direction in the second partial region.

9. The element according to claim 1, wherein
   the first partial region does not include oxygen, or an oxygen concentration in the first partial region is not more than $1/100$ of an oxygen concentration in the third partial region, and
   the second partial region does not include oxygen, or an oxygen concentration in the second partial region is not more than $1/100$ of the oxygen concentration in the third partial region.

10. The element according to claim 1, wherein
    a thickness of the third partial region along a first direction is not less than 0.1% and not more than 5% of a thickness of the photoelectric conversion layer along the first direction, and
    the first direction is from the first conductive layer toward the second conductive layer.

11. The element according to claim 1, wherein
    a thickness of the third partial region along a first direction is not less than 1 nm and not more than 20 nm, and
    the first direction is from the first conductive layer toward the second conductive layer.

12. The element according to claim 1, wherein
    a thickness of the third partial region along a first direction is less than a thickness of the first partial region along the first direction and less than a thickness of the second partial region along the first direction, and
    the first direction is from the first conductive layer toward the second conductive layer.

13. The element according to claim 1, further comprising:
    a second conductive layer-side intermediate layer located between the photoelectric conversion layer and the second conductive layer,
    the third partial region contacting the second conductive layer-side intermediate layer.

14. The element according to claim 13, wherein
the second conductive layer-side intermediate layer includes at least one selected from the group consisting of polyaniline, a polyaniline derivative, polythiophene, a polythiophene derivative, polyethylene dioxythiophene:polystyrenesulfonic acid (PEDOT:PSS), polyethyleneimine, a polyethyleneimine derivative, fullerene, a fullerene derivative, titanium oxide, zinc oxide, molybdenum oxide, tungsten oxide, aluminum oxide, copper oxide, vanadium oxide, nickel oxide, lithium oxide, calcium oxide, cesium oxide, copper iodide, copper thiocyanate, lithium fluoride (LiF), and metal calcium.

15. The element according to claim 1, wherein
the photoelectric conversion layer includes at least one of a compound expressed by $A^1BX^1_3$ or a compound expressed by $A^2_2A^1_{m-1}B_mX^1_{3m+1}$,
the $A^1$ is a monovalent cation including at least one selected from the group consisting of $Cs^+$, $Rb^+$, $K^+$, $Na^+$, $R^1NH_3^+$, $R^1_2NH_2^+$, and $HC(NH_2)_2^+$,
the $R^1$ in the $A^1$ is at least one monovalent group selected from the group consisting of hydrogen, a linear alkyl group including not less than 1 and not more than 18 carbon atoms, a branched alkyl group including not less than 1 and not more than 18 carbon atoms, a cyclic alkyl group including not less than 1 and not more than 18 carbon atoms, a substituted aryl group, a non-substituted aryl group, a substituted heteroaryl group, and a non-substituted heteroaryl group,
the $A^2$ is a monovalent cation including at least one selected from the group consisting of $R^1HN_3^+$, $R^1_2NH_2^+$, $C(NH_2)_3^+$, and $R^2C_2H_4NH_3^+$,
the $R^2$ in the $A^2$ is at least one monovalent group selected from the group consisting of a substituted aryl group, a non-substituted aryl group, a substituted heteroaryl group, and a non-substituted heteroaryl group,
the B is a divalent cation including at least one selected from the group consisting of $Pb_2^+$ and $Sn_2^+$,
the $X^1$ is at least one monovalent negative ion selected from the group consisting of $F^-$, $Cl^-$, $Br^-$, $I^-$, $SCN^-$, and $CH_3COO^-$, and
m is an integer not less than 1 and not more than 20.

* * * * *